United States Patent
Dolben

(10) Patent No.: US 11,642,746 B2
(45) Date of Patent: May 9, 2023

(54) SIMULTANEOUS RUN-IN DRIVING TOOL AND METHOD OF USE

(71) Applicant: Hamilton Sundstrand Corporation, Charlotte, CT (US)

(72) Inventor: Bradford Dolben, Somers, CT (US)

(73) Assignee: Hamilton Sundstrand Corporatoin, Charlotte, NC (US)

( * ) Notice: Subject to any disclaimer, the term of this patent is extended or adjusted under 35 U.S.C. 154(b) by 1151 days.

(21) Appl. No.: 16/248,336

(22) Filed: Jan. 15, 2019

(65) Prior Publication Data

US 2020/0223021 A1 Jul. 16, 2020

(51) Int. Cl.
| | | |
|---|---|---|
| *B23P 19/06* | (2006.01) | |
| *B25B 17/02* | (2006.01) | |
| *H01R 43/20* | (2006.01) | |
| *H01R 12/70* | (2011.01) | |

(52) U.S. Cl.
CPC ............ *B23P 19/069* (2013.01); *B25B 17/02* (2013.01); *H01R 43/205* (2013.01); *B23P 19/065* (2013.01); *H01R 12/7047* (2013.01)

(58) Field of Classification Search
CPC ....... B23P 19/069; B23P 19/065; B25B 17/02
USPC .................................. 81/57.22, 57.32, 57.36
See application file for complete search history.

(56) References Cited

U.S. PATENT DOCUMENTS

| | | | | |
|---|---|---|---|---|
| 4,515,043 A | * | 5/1985 | Gray ..................... | B23P 19/069 81/57.32 |
| 4,935,847 A | | 6/1990 | Welsh | |
| 5,169,334 A | | 12/1992 | Makita | |
| 5,218,758 A | | 6/1993 | Nguyen | |
| 6,543,314 B1 | * | 4/2003 | Hoyt ....................... | B25B 17/00 81/57.32 |
| 7,637,182 B1 | * | 12/2009 | Long ..................... | B23P 19/069 81/57.36 |

(Continued)

FOREIGN PATENT DOCUMENTS

| | | |
|---|---|---|
| CN | 107803654 A | 3/2018 |
| JP | S6368330 A | 3/1988 |
| JP | 2000084760 A | 3/2000 |

OTHER PUBLICATIONS

Universal Hinges Boring System—Series: CMT333-03, from Systems and accessories—Universal hinges boring system—CMT tools website, <http://www.cmtutensili.com/show_items.asp?pars=PJJ~CMT333-03~2~2~3 Dec. 11, 2018>, 2 page.

(Continued)

*Primary Examiner* — Sarang Afzali
(74) *Attorney, Agent, or Firm* — Kinney & Lange, P.A.

(57) ABSTRACT

A driving tool for driving jackset screws includes an input shaft, output shafts, gear assembly, driver heads, and a yoke. The input shaft is configured to receive torque. The first and second output shafts are operably connected to the input shaft via the gear assembly. The gear assembly includes a differential gear assembly rotatably engaged with the input shaft. The first driver head is attached to a distal end of the first output shaft. The second driver head is attached to a distal end of the second output shaft. The yoke is connected to and extends between ends of the first and second output shafts. The yoke defines a position of the distal ends of the first and second shafts relative to each other and is configured to adjust a distance between the first and second driver heads.

10 Claims, 3 Drawing Sheets

(56) References Cited

U.S. PATENT DOCUMENTS

| | | |
|---|---|---|
| 7,971,509 B2 | 7/2011 | Shortridge |
| 8,826,777 B1 | 9/2014 | Shieh |
| 2010/0175511 A1 | 7/2010 | Shortridge |
| 2013/0047790 A1 | 2/2013 | Shah et al. |

OTHER PUBLICATIONS

Extended European Search Report for EP Application No. 19211489.0, dated May 27, 2020, 9 pages.

* cited by examiner

SIMULTANEOUS RUN-IN DRIVING TOOL AND METHOD OF USE

BACKGROUND

The present disclosure generally relates to the installation of hardware. In particular, the present disclosure relates to a driving tool for installing multiple screws.

Circuit card assemblies ("CCAs") are utilized in avionics and electronics to perform a variety of functions. In most cases, more than one CCA is required in a controller assembly, and these CCAs are typically required to communicate with each other using connectors. Connectors with jackset hardware are often utilized due to their ability to stay connected in high stress environments, including during vibration, as they are not prone to backing out without being deliberately removed. A single turning jackset can only back out so far before the thread tightens, keeping the connector engaged.

With a jackset configuration, mating connectors are required to stay relatively parallel to each other in order to connect and disconnect. The receiving connector is equipped with fixed, threaded posts ("fixed jacksets"). The connector to be installed is equipped with free-spinning fasteners ("turning jacksets"). The turning jackset will not deflect from its axis, so that connectors will stay relatively parallel. Because of this design, if one jackset is turned too much, the connector will skew at an angle and cause the jackset threads to seize. Threads can easily be damaged because of this, resulting in repairs and/or reworks that can be costly.

SUMMARY

A driving tool for driving jackset screws into a connector for a circuit card assembly includes an input shaft, a first output shaft, a second output shaft, a gear assembly, a first driver head, a second driver head, and a yoke. The input shaft is configured to receive torque. The first and second output shafts are operably connected to the input shaft. The gear assembly is in operable communication with the input shaft and with the first and second output shafts. The gear assembly mechanically couples the input shaft to the first and second output shafts. The gear assembly includes a gearbox housing and a differential gear assembly rotatably engaged with the input shaft. The first driver head is attached to a distal end of the first output shaft and includes a first socket for receiving a first tool. The second driver head is attached to a distal end of the second output shaft and includes a second socket for receiving a second tool. The yoke is connected to and extends between ends of the first and second output shafts. The yoke defines a position of the distal ends of the first and second shafts relative to each other and is configured to adjust a distance between the first and second driver heads.

A method of driving two jackset screws with a driving tool includes applying torque to an input shaft of the driving tool. The torque received by the input shaft is directed to first and second output shafts with a gear assembly of the driving tool. Torque is transferred from the first output shaft to a first driver head attached to an end of the first input shaft that is opposite from the gear assembly. Torque is transferred from the second output shaft to a second driver head attached to an end of the second input shaft that is opposite from the gear assembly. The first and second driver heads are rotated approximately simultaneously in response to the torque transferred to the first and second driver heads from the first and second output shafts.

The present summary is provided only by way of example, and not limitation. Other aspects of the present disclosure will be appreciated in view of the entirety of the present disclosure, including the entire text, claims, and accompanying figures.

Figure 1:
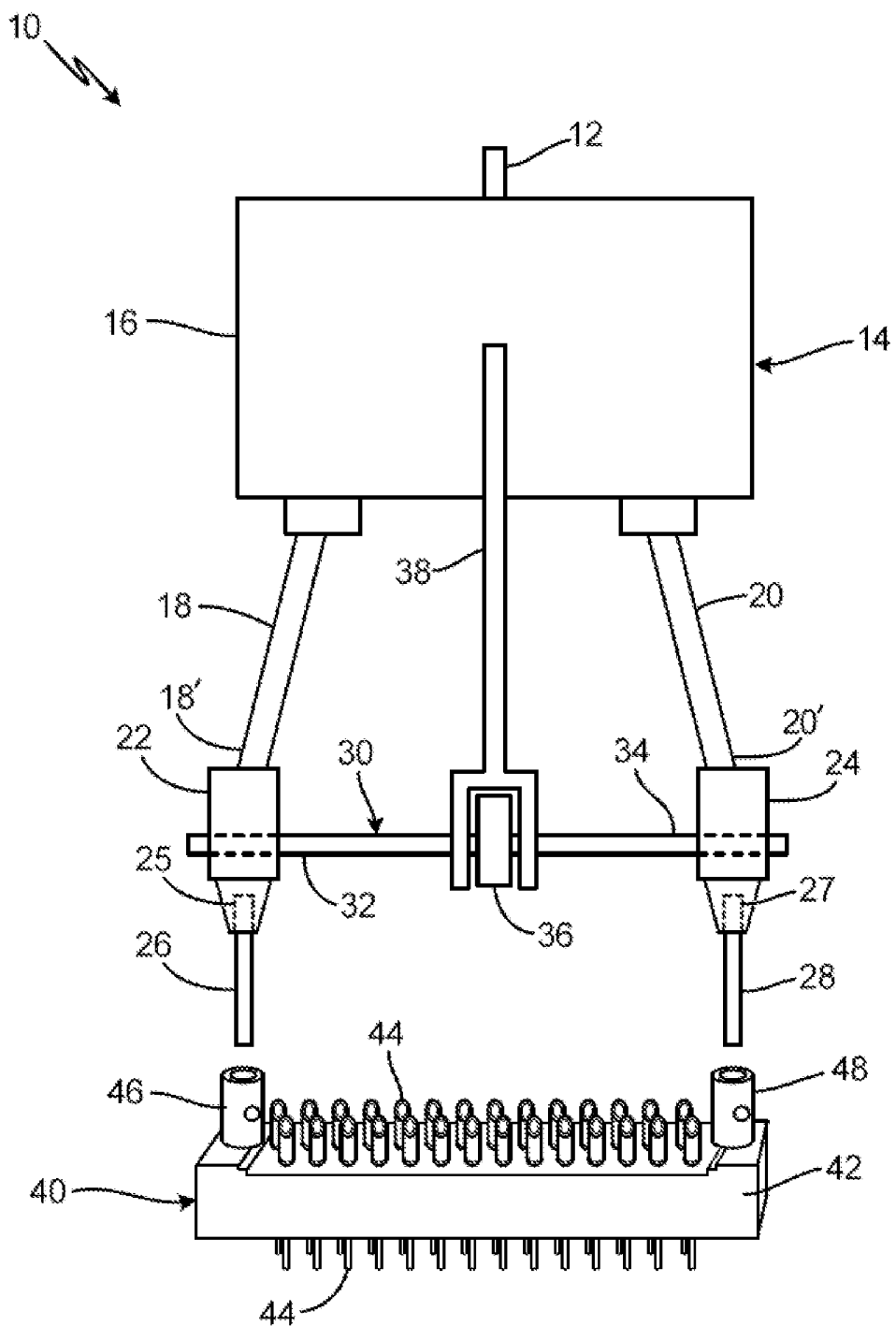
FIG. 1 is a simplified front view of a driving tool with two driver heads aligned with a connector.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

In order to keep the connectors in a CCA parallel to each other, the correct installation process requires that the jacksets be tightened alternately at a half-turn each until the connector is seated. This is a cumbersome process, and the temptation to take shortcuts is strong. Shortcuts can include alternating more than a half turn, or relying on the feeling of torque resistance prior to alternating.

Disclosed herein is a driving tool utilizing a differential gear to drive two separate universal shafts to transfer torque from a single input to two outputs so that connectors are kept parallel during the mating procedure and thereby significantly reducing the risk of damage due to thread seizure of the jacksets. Universal joints are incorporated to allow adjustability of width for single tool usage on multiple connector widths.

FIG. 1 is a simplified front view of driving tool 10 and shows input shaft 12, gearbox 14 (with housing 16), first output shaft 18, second output shaft 20, first driver head 22, second driver head 24, first socket 25, first tool 26, second socket 27, second tool 28, yoke 30 (with first end 32, second end 34, and nut 36), stabilizer 38, and connector 40 (with body 42, pins 44, first turning jackset 46 and second turning jackset 48).

Driving tool 10 is a tool for simultaneously driving two screws at the same time. Input shaft 12 is an elongated cylinder of solid material configured to rotate under torque, thereby driving other elements of driving tool 10. In one non-limiting embodiment, input shaft 12 can include features for receiving and/or connecting with a torque transferring device. Gearbox 14 is a system of gears. In this non-limiting embodiment, and as will be discussed further with respect to FIG. 3, gearbox 14 includes a gear assembly with a differential gear configuration. Housing 16 is a container for the gear assembly of gearbox 14.

First output shaft 18 and second output shaft 20 are elongated cylinders of solid material. First output shaft 18 includes distal end 18' and output shaft 20 includes distal end 20'. In this embodiment, and as will be discussed further with respect to FIG. 3, first output shaft 18 and second output shaft 20 include universal shafts with universal joints at each end of the shafts. First driver head 22 and second driver head 24 are each a sleeve with a socket for receiving first tool 26 and second tool 28, respectively. First socket 25 and second socket 27 are slots or holes shaped to receive first tool 26 and second tool 28, respectively. First tool 26 and second tool 28 are tool bit heads and can include any shape suitable for securing rotating fasteners, including a flat-head, hex key, and/or crossed double-slot head style tooling bits, as well as other standard configuration tool bit heads.

Yoke 30 is an elongated piece of sold material. In this non-limiting embodiment, yoke 30 includes a cylinder with threading extending a length of yoke 30. First end 32 and second end 34 are opposite ends of yoke 30. In this non-limiting embodiment, first end 32 and second end 34 each include a threading pattern that is opposite from the other. Nut 36 is a flat piece of solid material. Stabilizer 38 is a rod of solid material. Connector 40 is a multi-pin electrical connection element. In one example, connector 40 can be a D-subminiature electrical connector. Body 42 is a block of solid material. Pins 44 are individual metallic electrical leads. First turning jackset 46 and second turning jackset 48 are rotatable screws or bolts.

In this example, driving tool 10 is shown as out of contact, or disengaged with connector 40. During operation of driving tool 10, driving tool 10 is engaged with connector 40 by way of first tool 26 and second tool 28 inserting into first turning jacket 46 and second turning jacket 48, respectively. Input shaft 12 connects to the gear assembly of gearbox 14. Gearbox 14 is operably connected to input shaft 12, first output shaft 18, and to second output shaft 20.

First output shaft 18 and second output shaft 20 are operably connected to the gear assembly within housing 16 of gearbox 14. First driver head 22 is mounted to distal end 18' of first output shaft 18. Second driver head 24 is mounted to distal end 20' of second output shaft 20. First tool 26 is inserted into an opening or sleeve of first driver head 22. Second tool 28 is inserted into an opening or sleeve of second driver head 24.

Yoke 30 is connected to and extends between first and second driver heads 22 and 24. First end 32 is contiguously formed with and connected to second end 34. First end 32 is also in threadable engagement with first driver head 22. Second end 34 is in threadable engagement with second driver head 24. Nut 36 is mounted to yoke 30 at approximately a midpoint of yoke 30, with yoke 30 passing through a center of nut 36. Stabilizer 38 is connected to yoke 30 and is mounted to a portion of housing 16 of gearbox 14.

In FIG. 1, connector 40 is shown as positioned beneath and separated from driving tool 10. When engaged with driving tool 10, first turning jackset 46 will receive first tool 26 and second turning jackset will receive second tool 28. Pins 44 pass through and are mounted to body 42. First turning jackset 46 and second turning jackset 48 extend through portions of body 42. In this non-limiting embodiment, first turning jackset 46 and second turning jackset 48 can rotate freely with respect to body 42.

Driving tool 10 is used to drive both first turning jackset 46 and second turning jackset 48 simultaneously. Input shaft 12 receives torque from an external source and transfer that torque into the gear assembly within gearbox 14. In one example, the external source delivering torque to input shaft 12 can be a calibrated tool or a hand of an operator. Gearbox 14 directs the torque received by input shaft 12 to first and second output shafts 18 and 20.

First output shaft 18 transfers torque from the gear assembly to first driver head 22. Second output shaft 20 transfers torque from the gear assembly to second driver head 24. First driver head 22 rotates in response to torque delivered from first output shaft 18 thereby rotating first tool 26. Second driver head 24 rotates in response to torque delivered from second output shaft 20 thereby rotating second tool 28. First tool 26 rotates in response to the rotation of first driver head 22 and transfers torque to first turning jackset 46. Second tool 28 rotates in response to the rotation of second driver head 24 and transfers torque to second turning jackset 48.

Yoke 30 is configured to adjust a distance between first and second driver heads 22 and 24 by defining a position of the distal ends of first and second output shafts 18 and 20 relative to each other. Yoke adjusts the distance between first and second driver heads 22 and 24 via the threadable engagement between first and second ends 32 and 34 of yoke 30 with first and second driver heads 22 and 24, respectively. For example, nut 36 can be spun in a first direction causing first and second driver heads 22 and 24 to move towards nut 36 along yoke 30. In another example, nut 36 is spun in an opposite direction causing first and second driver heads 22 and 24 to move away from nut 36 along yoke 30. In addition, because first and second driver heads 22 and 24 are held in place by yoke 30, a proper (e.g., parallel) alignment and a consistent width of first and second tools 26 and 28 are maintained as driving tool 10 is brought into engagement with connector 40. For example, a parallel alignment of first and second driver heads 22 and 24 is maintained by way of one or more universal joints used with first and second output shafts 18 and 20 (see e.g., FIG. 3).

Stabilizer 38 braces and/or supports yoke 30 relative to housing 16 so as limit relative longitudinal displacement (e.g., from left-to-right and right-to-left as shown in FIG. 1) between housing 16 and yoke 30. Connector 40 connects a first communication device with a second communication device. In some non-limiting embodiments, the first and/or second communication devices can include wires, cables, circuit cards, electronic devices, and/or other connectors. Body 42 provides a rigid structure by which pins 44 and first and second turning jackets 46 and 48 are held in correct positioning. Pins 44 transfer electrical signals. First turning jackset 46 and second turning jackset 48 threadably engage with another component so as to connect and attach connector 40 to the other component.

Driving tool 10 enables simultaneous run-in of first and second turning jacksets 46 and 48. This simultaneous run-in will keep connector 40 in a correct alignment during a mating procedure with another component, significantly reducing risk of damage due to thread seizure of first and second turning jacksets 46 and 48. Using driving tool 10 also reduces the assembly time required since driving tool 10 only requires a single engagement step and due to first and second turning jacksets 46 and 48 being run-in simultaneously.

Figure 2:
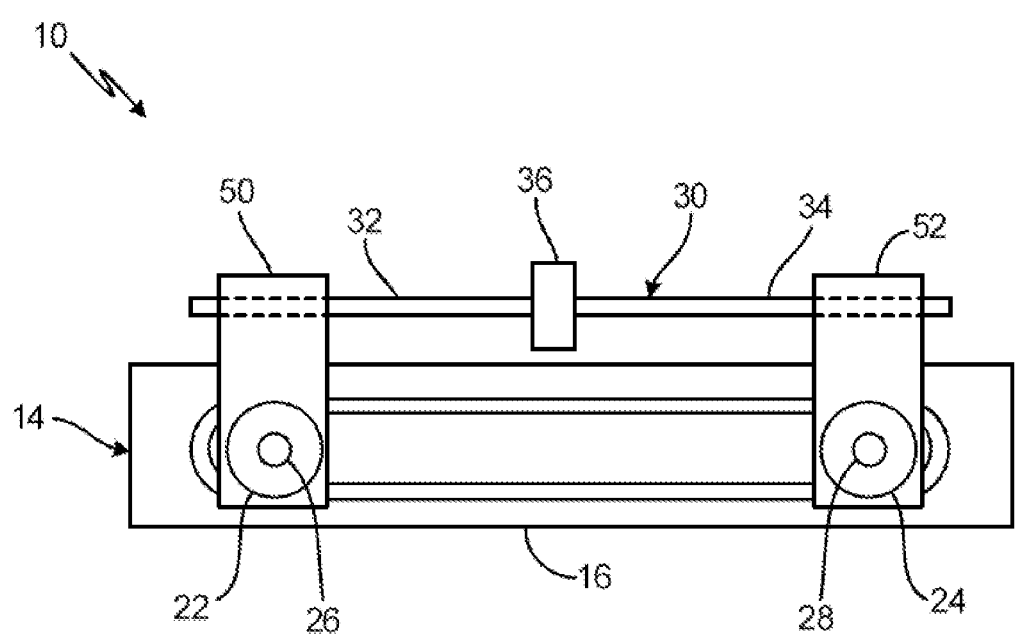
FIG. 2 is a bottom view of an adjustment assembly of the driving tool of FIG. 1.

FIG. 2 is a bottom view of driving tool 10 and shows gearbox 14, housing 16, first driver head 22, second driver head 24, first tool 26, second tool 28, yoke 30 (with first end 32, second end 34, and nut 36), first mount 50, and second mount 52.

In FIG. 2, driving tool 10 is shown with first and second mounts 50 and 52. First and second mounts 50 and 52 are blocks of solid material. First end 32 of yoke 30 passes through a portion of first mount 50 and first driver head 22 passes through another portion of first mount 50. Second end 34 of yoke 30 passes through a portion of second mount 52 and second driver head 24 passes through another portion of second mount 52. First and second mounts 50 and 52 act as supports for first and second ends 32 and 34, respectively of yoke 30.

Yoke 30 is threadably engaged with first and second mounts 50 and 52. In operation, first and second mounts 50 and 52 move closer together as yoke 30 is rotated in a first direction (due to the opposing thread directions as between first end 32 and second end 34 of yoke 30). As yoke 30 is rotated in a second direction (i.e., opposite from the first direction), first and second mounts 50 and 52 move away from each other. This adjustable width capability provided by yoke 30 enables driving tool 10 to be used for multiple connector sizes.

Figure 3:
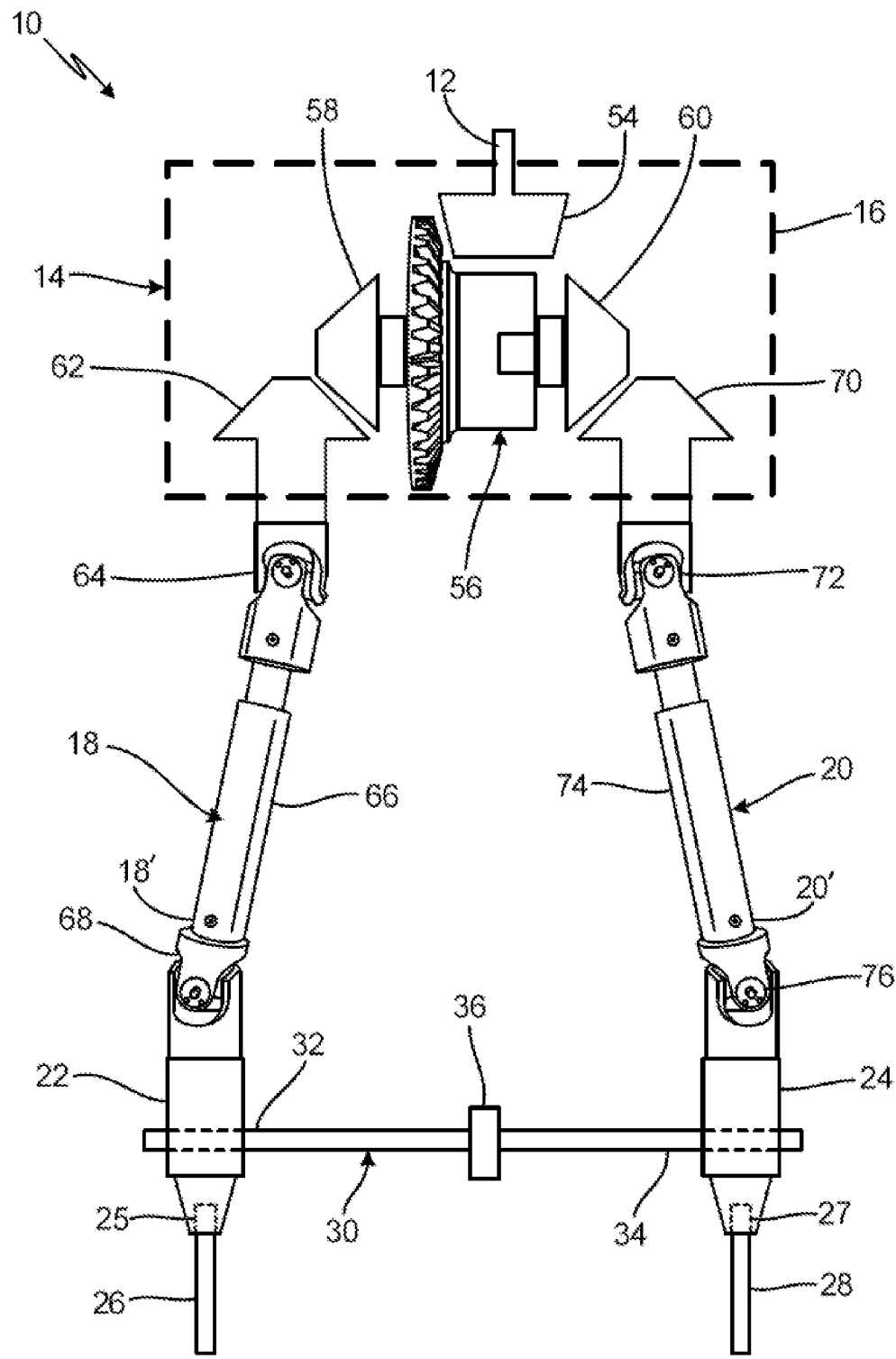
FIG. 3 is a schematicized front view of the driving tool of FIGS. 1 and 2 with the gear box housing shown in phantom, and shows a gear assembly.

FIG. 3 is a schematicized front view of one embodiment of driving tool 10 shown in more detail than FIG. 1 and with housing 16 shown in phantom for clarity. FIG. 3 shows driving tool 10, input shaft 12 (with input gear 54), gearbox 14 (with housing 16, differential gear unit 56, first bevel gear 58, and second bevel gear 60), first output shaft 18 (with first output gear 62, first upper universal joint 64, first universal shaft 66, and first lower universal joint 68), second output shaft 20 (with second output gear 70, second upper universal joint 72, second universal shaft 74, and second lower universal joint 76), first driver head 22, second driver head 24, first tool 26, second tool 28, and yoke 30 (with first end 32, second end 34, and nut 36).

Input gear 54, first bevel gear 58, second bevel gear 60, first output gear 62, and second output gear 70 are toothed wheels for transmitting torque. In this non-limiting embodiment, input gear 54, first bevel gear 58, second bevel gear 60, first output gear 62, and second output gear 70 are beveled pinion gears. Differential gear unit 56 is a differential gear train. First upper universal joint 64, first lower universal joint 68, second upper universal joint 72, and second lower universal joint 76 are joints for transferring rotary motion between non-parallel shafts. First universal shaft 66 and second universal shaft 74 are shafts with a universal joint on each end.

Teeth of input gear 54 are engaged with teeth of differential gear unit 56. Differential gear unit 56 is positioned inside of housing 16 of gearbox 14. First bevel gear 58 is engaged with first output gear 62 via corresponding teeth on each of first bevel gear 58 and first output gear 62. Second bevel gear 60 is engaged with second output gear 70 via corresponding teeth on each of second bevel gear 60 and second output gear 70.

First output gear 62 is attached and connected to first upper universal joint 64. First upper universal joint 64 is attached to both of first output gear 62 and first universal shaft 66. First universal shaft 66 is attached to both of first upper universal joint 64 and first lower universal joint 68. First lower universal joint 68 is attached to both of first universal shaft 66 and first driver head 22. Second output gear 70 is attached and connected to second upper universal joint 72. Second upper universal joint 72 is attached to both of second output gear 70 and second universal shaft 74. Second universal shaft 74 is attached to both of second upper universal joint 72 and second lower universal joint 76. Second lower universal joint 76 is attached to both of second universal shaft 74 and second driver head 24.

Input gear 54 transfers torque from input shaft 12 to differential gear unit 56. Differential gear unit 56 directs torque received from the input gear 54 to first and second output shafts 18 and 20, respectively via first and second differential gears 58 and 60. Differential gear unit 56 operates by causing first bevel gear 58 and second bevel gear 60 to rotate at speeds such that a speed of input gear 54 is the average of the speed of first bevel gear 58 and second bevel gear 60. For example, an increase in the speed of first bevel gear 58 is balanced by a decrease in the speed of second bevel gear 60, and vice versa. During operation, in the event one of first and second turning jacksets 46 and 48 seizing due to misalignment, differential gear unit 56 will transfer torque away from the seizing turning jackset (e.g., first turning jackset 46) to the other turning jackset (e.g., second turning jackset 48), thereby leveling connector 40 and resuming the same RPM for both first and second turning jacksets 46 and 48.

In one example, differential gear unit 56 varies an amount of torque directed to at least one of first and second output shafts 18 and 20 such that a first amount of torque directed to first output shaft 18 is different that a second amount of torque delivered to second output shaft 20. The differential gear unit 56 can vary the torque directed to either of first and second output shafts 18 and 20 in response to a change in rotational resistance to one of first or second driver heads 22 and 24 caused by a seizure of one of first or second turning jacksets 46 or 48.

First bevel gear 58 transfers torque from differential gear unit 56 to first output gear 62. Second bevel gear 60 transfers torque from differential gear unit 56 to second output gear 70. First output gear 62 transfers torque from first bevel gear 58 to first output shaft 18. First upper universal joint 64 transfers torque from first output gear 62 to first universal shaft 66. First universal shaft 66 transfers torque from first upper universal joint 64 to first lower universal joint 68. First lower universal joint 68 transfers torque from first universal shaft 66 to first driver head 22. Second output gear 70 transfers torque from second bevel gear 60 to second upper universal joint 72. Second upper universal joint 72 transfers torque from second output gear 70 to second universal shaft 74. Second universal shaft 74 transfers torque from second upper universal joint 72 to second lower universal joint 76. Second lower universal joint 76 transfers torque from second universal shaft 74 to second driver head 24.

As a result, first and second driver heads 22 and 24 are rotated approximately simultaneously in response to the torque transferred to first and second driver heads 22 and 24 from first and second output shafts 18 and 20. Utilizing differential gear unit 56 in driving tool 10 reduces the risk of seizing during installation and keeps first and second turning jacksets 46 and 48 spinning at the same speed, thereby transferring torque away from a seizing jackset to level connector 40.

Discussion of Possible Embodiments

The following are non-exclusive descriptions of possible embodiments of the present invention.

A driving tool for driving jackset screws into a connector for a circuit card assembly, the driving tool comprising: an input shaft configured to receive torque; a first output shaft operably connected to the input shaft; a second output shaft operably connected to the input shaft; a first gear assembly in operable communication with the input shaft and with the first and second output shafts, such that the first gear assembly mechanically couples the input shaft to the first and second output shafts, wherein the first gear assembly comprises: a gearbox housing; and a second gear assembly disposed in the gearbox housing, wherein the second gear assembly is rotatably engaged with the input shaft; a first driver head attached to the first output shaft; a second driver head attached to the second output shaft; and a yoke connected to and extending between the first and second output shafts, wherein the yoke defines a position of the distal ends of the first and second shafts relative to each other.

The driving tool of the preceding paragraph can optionally include, additionally and/or alternatively, any one or more of the following features, configurations and/or additional components:

A further embodiment of the foregoing driving tool, further comprising a stabilizer rigidly connected to the yoke and to the gear box housing, such that the stabilizer limits relative longitudinal displacement between the gear box housing and the yoke.

A further embodiment of the foregoing driving tool, wherein the yoke comprises: a first end with a first thread; a second end with a second thread, the second end opposite the first end, wherein the second thread is in an opposite direction than the first thread; and a nut disposed between the first and second ends.

A further embodiment of the foregoing driving tool, and further: wherein the first output shaft comprises: a first universal shaft; and first universal joints connected to ends of the first universal shaft; and wherein the second output shaft comprises: a second universal shaft; and second universal joints connected to ends of the second universal shaft.

A further embodiment of the foregoing driving tool, wherein the second gear assembly comprises a differential gear assembly.

A further embodiment of the foregoing driving tool, wherein the yoke is configured to adjust a distance between the first and second driver heads.

A further embodiment of the foregoing driving tool, wherein the first driver head attached to a distal end of the first output shaft, the first driver head with a first socket for receiving a first tool, wherein the second driver head attached to a distal end of the second output shaft, the second driver head with a second socket for receiving a second tool.

A method of driving two jackset screws with a driving tool, the method comprising: applying torque to an input shaft of the driving tool; directing the torque received by the input shaft to first and second output shafts with a gear assembly of the driving tool; transferring torque from the first output shaft to a first driver head attached to an end of the first input shaft that is opposite from the gear assembly; transferring torque from the second output shaft to a second driver head attached to an end of the second input shaft that is opposite from the gear assembly; and rotating the first and second driver heads approximately simultaneously in response to the torque transferred to the first and second driver heads from the first and second output shafts.

The method of the preceding paragraph can optionally include, additionally and/or alternatively, any one or more of the following features, configurations and/or additional components:

A further embodiment of the foregoing method, further comprising adjusting a distance between the first and second driver heads by rotating a yoke in threadable engagement with portions of both the first and second driver heads.

A further embodiment of the foregoing method, further comprising: aligning the first and second driver heads with the two jackset screws, wherein the first driver head contains a portion of a first tool and the second driver head contains a portion of a second tool; and bringing the first tool into engagement with the first jackset screw and the second tool into engagement with the second jackset screw.

A further embodiment of the foregoing method, further comprising varying an amount of torque directed to at least one of the first and second output shafts, such that a first amount of torque directed to the first output shaft is different that a second amount of torque delivered to the second output shaft.

A further embodiment of the foregoing method, wherein varying an amount of torque directed to at least one of the first and second output shafts comprises varying the torque in response to a change in rotational resistance to one of the first and second driver heads.

A further embodiment of the foregoing method, further comprising maintaining a parallel alignment of the first and second driver heads as the first and second driver heads are rotated.

A further embodiment of the foregoing method, wherein the parallel alignment of the first and second driver heads is maintained by way of one or more universal joints used with the first and second output shafts.

A further embodiment of the foregoing method, wherein the first driver head is attached to an end of the first input shaft that is opposite from the gear assembly, wherein the second driver head is attached to an end of the second input shaft that is opposite from the gear assembly.

Summation

Any relative terms or terms of degree used herein, such as "substantially", "essentially", "generally", "approximately" and the like, should be interpreted in accordance with and subject to any applicable definitions or limits expressly stated herein. In all instances, any relative terms or terms of degree used herein should be interpreted to broadly encompass any relevant disclosed embodiments as well as such ranges or variations as would be understood by a person of ordinary skill in the art in view of the entirety of the present disclosure, such as to encompass ordinary manufacturing tolerance variations, incidental alignment variations, alignment or shape variations induced by thermal, rotational or vibrational operational conditions, and the like.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A driving tool for driving jackset screws into a connector for a circuit card assembly, the driving tool comprising:
  an input shaft configured to receive torque;
  a first output shaft operably connected to the input shaft;
  a second output shaft operably connected to the input shaft;
  a gearbox assembly in operable communication with the input shaft and with the first and second output shafts, such that the gearbox assembly mechanically couples the input shaft to the first and second output shafts, wherein the gearbox assembly comprises:
  a gearbox housing; and a gear assembly disposed in the gearbox housing, wherein the gear assembly is rotatably engaged with the input shaft to drive the first output shaft and the second output shaft;

a first driver head attached to the first output shaft;

a second driver head attached to the second output shaft; and a yoke connected to and extending between the first and second output shafts, wherein the yoke defines a position of the distal ends of the first and second shafts relative to each other;

wherein:
the yoke comprises:
a first end with a first thread;
a second end with a second thread, the second end opposite the first end, wherein the second thread is in an opposite direction than the first thread; and
a nut disposed between the first and second ends;
the yoke is configured to adjust a distance between the first and second driver heads;
the first driver head is attached to a distal end of the first output shaft, the first driver head with a first socket for receiving a first tool, and
the second driver head attached to a distal end of the second output shaft, the second driver head with a second socket for receiving a second tool.

2. The driving tool of claim 1, further comprising a stabilizer rigidly connected to the yoke and to the gearbox housing, such that the stabilizer limits relative longitudinal displacement between the gearbox housing and the yoke.

3. The driving tool of claim 1, and further:
wherein the first output shaft comprises:
a first universal shaft; and
first universal joints connected to ends of the first universal shaft; and
wherein the second output shaft comprises:
a second universal shaft; and
second universal joints connected to ends of the second universal shaft.

4. The driving tool of claim 1, wherein the gear assembly comprises a differential gear assembly.

5. A method of driving two jackset screws with the driving tool of claim 1, the method comprising:

applying torque to the input shaft of the driving tool;

directing the torque received by the input shaft to the first and second output shafts via the gear assembly of the gearbox assembly;

transferring torque from the first output shaft to the first driver head;

transferring torque from the second output shaft to the second driver head;

rotating the first and second driver heads simultaneously in response to the torque transferred to the first and second driver heads from the first and second output shafts; and adjusting the distance between the first and second driver heads by rotating the yoke via threadable engagement with portions of both the first and second driver heads.

6. The method of claim 5, further comprising:
aligning the first and second driver heads with the two jackset screws, wherein the first driver head contains a portion of a first tool and the second driver head contains a portion of a second tool; and
bringing the first tool into engagement with the first jackset screw and the second tool into engagement with the second jackset screw.

7. The method of claim 5, further comprising varying an amount of torque directed to at least one of the first and second output shafts, such that a first amount of torque directed to the first output shaft is different than a second amount of torque delivered to the second output shaft.

8. The method of claim 7, wherein varying an amount of torque directed to at least one of the first and second output shafts comprises varying the torque in response to a change in rotational resistance to one of the first and second driver heads.

9. The method of claim 5, further comprising maintaining a parallel alignment of the first and second driver heads as the first and second driver heads are rotated.

10. The method of claim 9, wherein the parallel alignment of the first and second driver heads is maintained by way of one or more universal joints used with the first and second output shafts.

* * * * *